(12) United States Patent
Prouet et al.

(10) Patent No.: US 7,652,509 B2
(45) Date of Patent: Jan. 26, 2010

(54) DIFFERENTIAL INPUT AND OUTPUT TRANSCONDUCTANCE CIRCUIT

(75) Inventors: Sébastien Prouet, Caen (FR); Hervé Marie, Ver sur Mer (FR)

(73) Assignee: ST-Ericsson SA, Geneva (CH)

( * ) Notice: Subject to any disclaimer, the term of this patent is extended or adjusted under 35 U.S.C. 154(b) by 125 days.

(21) Appl. No.: 10/575,425

(22) PCT Filed: Oct. 6, 2004

(86) PCT No.: PCT/IB2004/003291

§ 371 (c)(1),
(2), (4) Date: Apr. 10, 2006

(87) PCT Pub. No.: WO2005/036736

PCT Pub. Date: Apr. 21, 2005

(65) Prior Publication Data

US 2007/0139110 A1  Jun. 21, 2007

(30) Foreign Application Priority Data

Oct. 13, 2003  (EP) .................................. 03292541

(51) Int. Cl.
*H02M 11/00* (2006.01)
*H03F 3/45* (2006.01)
(52) U.S. Cl. ......................... 327/103; 323/312; 323/315
(58) Field of Classification Search .................. 327/103; 323/315, 312

See application file for complete search history.

(56) References Cited

U.S. PATENT DOCUMENTS 4,682,098 A * 7/1987 Seevinck et al. ............ 323/315
4,692,712 A   9/1987 Quinn
(Continued)

FOREIGN PATENT DOCUMENTS

JP   55035516 A   3/1980
(Continued)

OTHER PUBLICATIONS

PCT International Search Report, PCT/IB2004/003291, mailing date Dec. 28, 2004.

*Primary Examiner*—Lincoln Donovan
*Assistant Examiner*—John W Poos
(74) *Attorney, Agent, or Firm*—Scott J. Hawranek; William J. Kubida; Hogan & Hartson LLP

(57) ABSTRACT

The present invention relates to a transconductance circuit intended to convert a differential input voltage, supplied as two signals to two inputs, IN+ and IN− respectively, into a differential output current. According to the invention, each of the two signals of said differential input voltage is supplied to each input, IN+ and IN− respectively, through a follower transistor, TF+ and TF− respectively, connected to said input, IN+ and IN− respectively, by its emitter and receiving said signal on a control electrode. Moreover, each of the two inputs, IN+ and IN− respectively, of the transconductance is connected to a respective current source, CS− and CS+ respectively, that is dynamically controlled by the other input of the transconductance, IN− and IN+ respectively, said current source, CS− and CS+ respectively, being such that the current supplies to each input, IN+ and IN− respectively, by said current source, CS− and CS+ respectively, eliminates current variations caused by voltage variations of the input voltage signal.

7 Claims, 5 Drawing Sheets

U.S. PATENT DOCUMENTS

| | | | | |
|---|---|---|---|---|
| 4,973,857 | A | * 11/1990 | Hughes | 327/538 |
| 5,151,625 | A | * 9/1992 | Zarabadi et al. | 327/103 |
| 5,311,144 | A | 5/1994 | Grasset | |
| 5,339,044 | A | 8/1994 | Perraud | |
| 5,463,308 | A | * 10/1995 | Vorenkamp et al. | 323/312 |
| 5,497,123 | A | * 3/1996 | Main et al. | 330/257 |
| 5,578,943 | A | * 11/1996 | Sasaki | 326/86 |
| 5,963,064 | A | * 10/1999 | Toyota et al. | 327/103 |
| 6,219,261 | B1 | * 4/2001 | Stochino | 363/73 |

FOREIGN PATENT DOCUMENTS

JP 56020315 A 2/1981

\* cited by examiner

DIFFERENTIAL INPUT AND OUTPUT TRANSCONDUCTANCE CIRCUIT

FIELD OF THE INVENTION

The present invention relates to a transconductance circuit intended to convert a differential input voltage, supplied on two inputs, into a differential output current. More particularly, the invention relates to transconductance intended to be implemented in an upconverter circuit and presenting a high linearity and low noise.

BACKGROUND OF THE INVENTION

Such a highly linear differential transconductance is presented in patent U.S. Pat. No. 5,497,123. This differential transconductance combines two sides each including a single input transconductance. Such a transconductance is a class AB transconductance. This class is advantageous as this is an intermediate between class A, where the consumption is independent of the processed signal, and class B, where there is consumption only when a signal is processed. Advantages of class AB transconductance are also that they present a weak DC and are linear on a large range. Such a transconductance is presented for implementation in a reception chain. As such the transconductance exhibits a low input impedance to match the image rejection filter output impedance. Consequently, the presented transconductance is well adapted to the reception chain as the obtained gain is inversely proportional to the input impedance. A low input impedance is adapted to discrete applications where the input of the transconductance is an off-chip input.

For integrated applications the input impedance needs to be high in order to reduce the consumption. Moreover, such a transconductance is not adapted to the use in transmission chains where a large and linear input impedance is generally asked for upconversion circuits.

SUMMARY OF THE INVENTION

The inventors have sought a design for a low-noise highly linear class AB transconductance presenting a high input impedance.

This aim and others are reached with a transconductance circuit as presented in the introductory paragraph characterized in that, where each of the two signals of said differential input voltage is supplied to each input through a follower transistor connected to said input by its emitter and receives said signal on a control electrode, each of the two inputs of the transconductance is connected to a respective current source that is dynamically controlled by the other input of the transconductance, said current source being such that the current supplied to each input eliminates current variations caused by voltage variations of the input voltage signal.

The invention combines the use of a common collector stage realized through a follower transistor having its emitter connected to the input and the use of a positive feedback from one input to the other in order to cancel out current variations flowing in the follower transistors. Effectively, a simple follower transistor is not able to drive low input impedance with a large input voltage. The combination with a current source providing a positive feedback enables to cancel large variations generated in the collector current of the follower transistor. Effectively, these current variations modulate the base-emitter voltage of said follower transistor and hence introduce distortion, unless it is driven with a very large current. A linear, low-noise, high impedance class AB transconductance circuit is thus obtained.

An implementation of the invention is such that the transconductance circuit comprises two sides, each side comprising an input, an output, at least a first transistor having a control electrode coupled for receiving a bias voltage, a first electrode connected to said output and a second electrode connected to said input, a second transistor having a first electrode and a control electrode coupled in common to said input and a second electrode connected to a power supply terminal.

Advantageously, said first and second transistors are of the same size.

In an implementation of the invention, wherein each side further includes a third transistor of the same size on said second transistor, said third transistor has a control electrode coupled to said first transistor and control electrodes of said second transistor, a first electrode connected to the output of the other side and a second electrode connected to said power supply terminal.

Such an implementation is known for providing a high linearity of the transfer function of the transconductance for a large input voltage. As said third transistor is of the same size as said second transistor, the transfer function is symmetrical with both negative and positive input voltages.

The first transistor handles a very large amount of current during negative excursion of the input voltage. In contrast, second and third transistors handle a very large amount of current during positive excursion of the input voltage. Acting together, these transistors provide a transfer function which is linear to both positive and negative input voltages whatever the relative size of said first and second transistors. In a simple implementation, the first and second transistors are of the same size.

An implementation of the current source is thus such that said current source includes a current mirror mirroring the current passing through said second transistor with a gain of two. For instance, said current mirror includes a mirror transistor of twice the size of said second transistor, said mirror transistor having a control electrode connected to the first transistor and control electrodes of said second transistor, a first electrode connected to the input of the other side and a second electrode connected to said power supply terminal.

The invention also relates to a chip intended to be implemented in a transmission chain and to a transmission device including such a chip.

These and other aspects of the invention will be apparent from and will be elucidated with reference to the embodiments described hereinafter.

BRIEF DESCRIPTION OF THE DRAWINGS

The present invention will now be described in more detail, by way of example, with reference to the accompanying drawings, wherein.

DETAILED DESCRIPTION OF THE INVENTION

Figure 1:
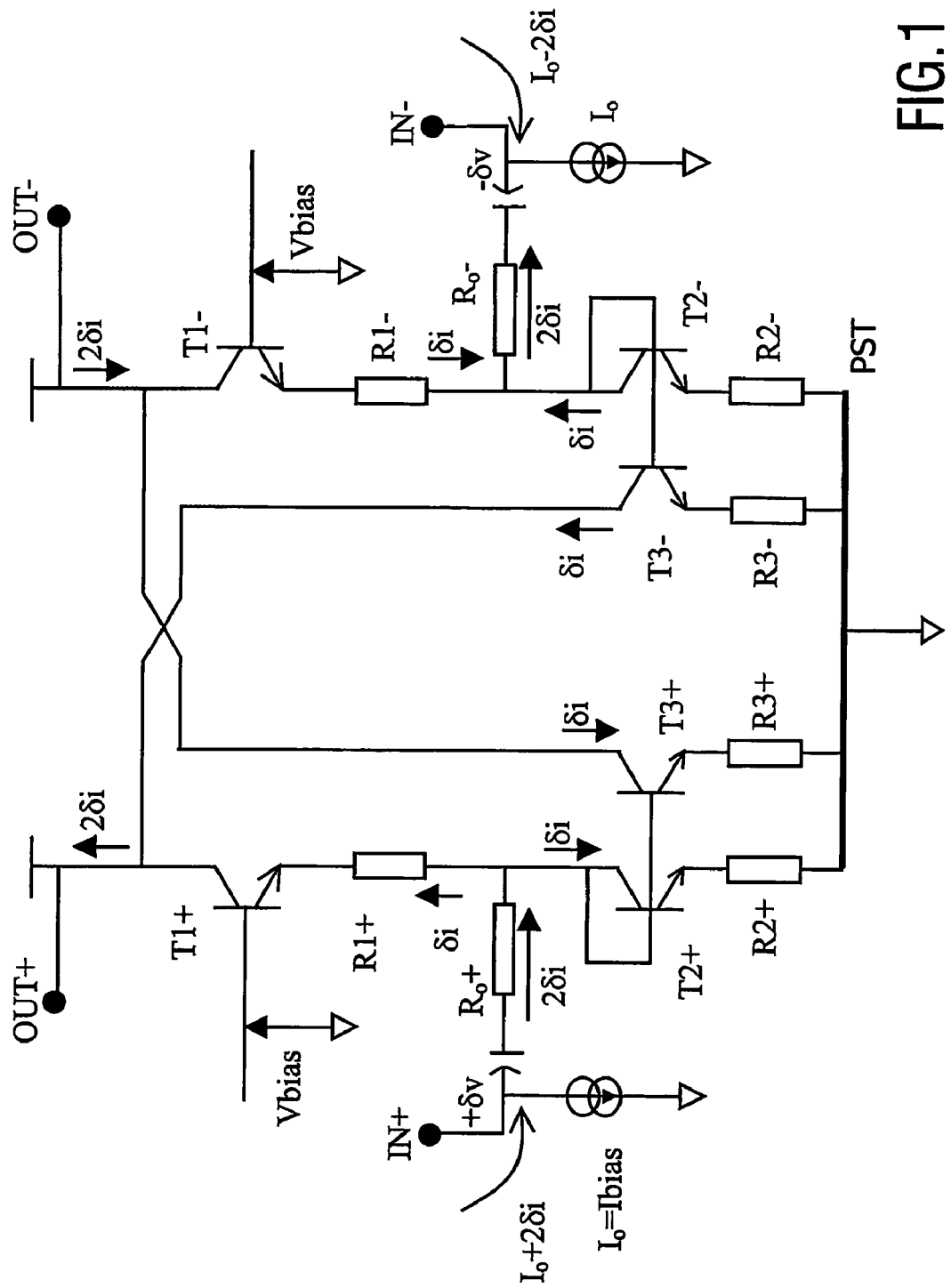
FIG. 1 is a schematic diagram of a transconductance as described in the prior art.

FIG. 1 represents a transconductance circuit of the prior art. This transconductance circuit has two inputs IN+, IN− for receiving an differential input signal, and outputs OUT+, OUT− for providing a differential output signal. It includes two symmetrical sides each comprising three transistors T1+, T2+, T3+ for the first side and T1−, T2−, T3− for the second side. Said transistors are bipolar or MOS transistors having a collector, a base and an emitter respectively, corresponding to a first electrode, a control electrode and a second electrode.

Transistors T1+ and T1− have a control electrode coupled for receiving a bias voltage, a first electrode connected to said output, OUT+ and OUT− respectively, and a second electrode connected to said input, IN+ and IN− respectively, biased by a constant current Ibias.

Transistors T2+ and T2− are in a diode configuration having a collector and base coupled in common and an emitter coupled for receiving a power supply voltage (e.g. ground) from a power supply terminal PST.

Transistors T3+ and T3− have a control electrode coupled to said first transistor and control electrodes of said second transistor, T2+ and T2− respectively, a first electrode connected to the output of the other side, OUT− and OUT+ respectively, and a second electrode connected to said power supply terminal PST.

Connections of these transistors to the power supply terminal and to the input or output of the circuit may be realized through resistors. For example, in FIG. 1, connection of second electrode of said first transistors T1+ and T1− to the input is realized through resistors R1+ and R1−. Connections of said second and third transistors to the power supply terminal PST are realized through resistors R2+, R2− and R3+, R3−. Said resistors have equal value in pairs and it is advantageous that they all have the same value. Such a remark is also applicable to the transconductance circuit of the invention represented in FIG. 2.

An input signal having a positive incursion in voltage relative to a bias point Vbias applied, for example, to input IN+ reduces the voltage across the base emitter junction of transistor T1+. Conversely, a voltage across the base-emitter junction of transistor T2+ is increased. Transistor T3+ is a mirror transistor of a current mirror circuit formed by transistors T2+ and T3+. The increase in base-emitter voltage of transistor T2+ is mirrored to transistor T3+, which increases a current provided at output OUT−.

Meanwhile, on the other side, an input signal having a negative incursion in voltage relative to a bias point Vbias is provided to input IN−. It has the opposite effect. A voltage across the base-emitter voltage of transistor T1− is increased by the negative voltage. Conversely, a voltage across the base-emitter junction of transistor T2− is decreased. The input signal having a negative voltage results in an increase in current at output OUT− and a decrease in current at output OUT+. The effects of the two sides of the transconductance go in the same way.

This transconductance continues to perform linearly under extreme conditions where the signal current is equal or bigger than the bias current and is not limited by a current source that biases the circuit. On each side, either transistor T1 or transistor T2 is turned off due to a large input voltage. For example, an input signal having a large positive voltage applied to input IN+ turns off transistor T1+, but increases the current through transistor T2+ which is mirrored to the output OUT−. This output OUT− also receives the current from T1− while T2− is turned off. Effectively, a large negative voltage applied to input IN− turns off transistors T2− and T3−, but linearly increases the current through transistor T1− which is provided at output OUT−. Thus, the transconductance remains linear even under large negative or positive input voltage swings.

Nevertheless, as stated above, this transconductance has a low input impedance. An adaptation of the impedance could be done at each input IN+ and IN− of said transconductance. The elements of such an adaptation of impedance, if active, present the drawback of adding distortion to the input signal. Indeed, the current variations flowing in the active, and thus non linear adaptative circuit, generate distortion.

The effect of a signal δv of the input voltage is shown in FIG. 1. Such a voltage variation +δv provided as IN+ results in a current variation δi in each of the two transistors T1+ and T1−. This current variation is then mirrored and an amplified variation of 2δi is obtained on output OUT+. A current $I_o+2\delta I$ or $I_o-2\delta I$ needs to be provided or absorbed by the impedance adaptation elements as the input is biased by a constant current Ibias. The impedance adaptation elements will consequently increase this variation and add distortion. For example, when the adaptation is realized through an emitter-follower transistor, the base-emitter voltage of said follower transistor should consequently change, leading to distortion. Moreover, it makes the noise contribution from the adaptative circuit high when this circuit is momentarily biased at a low current.

Figure 2:
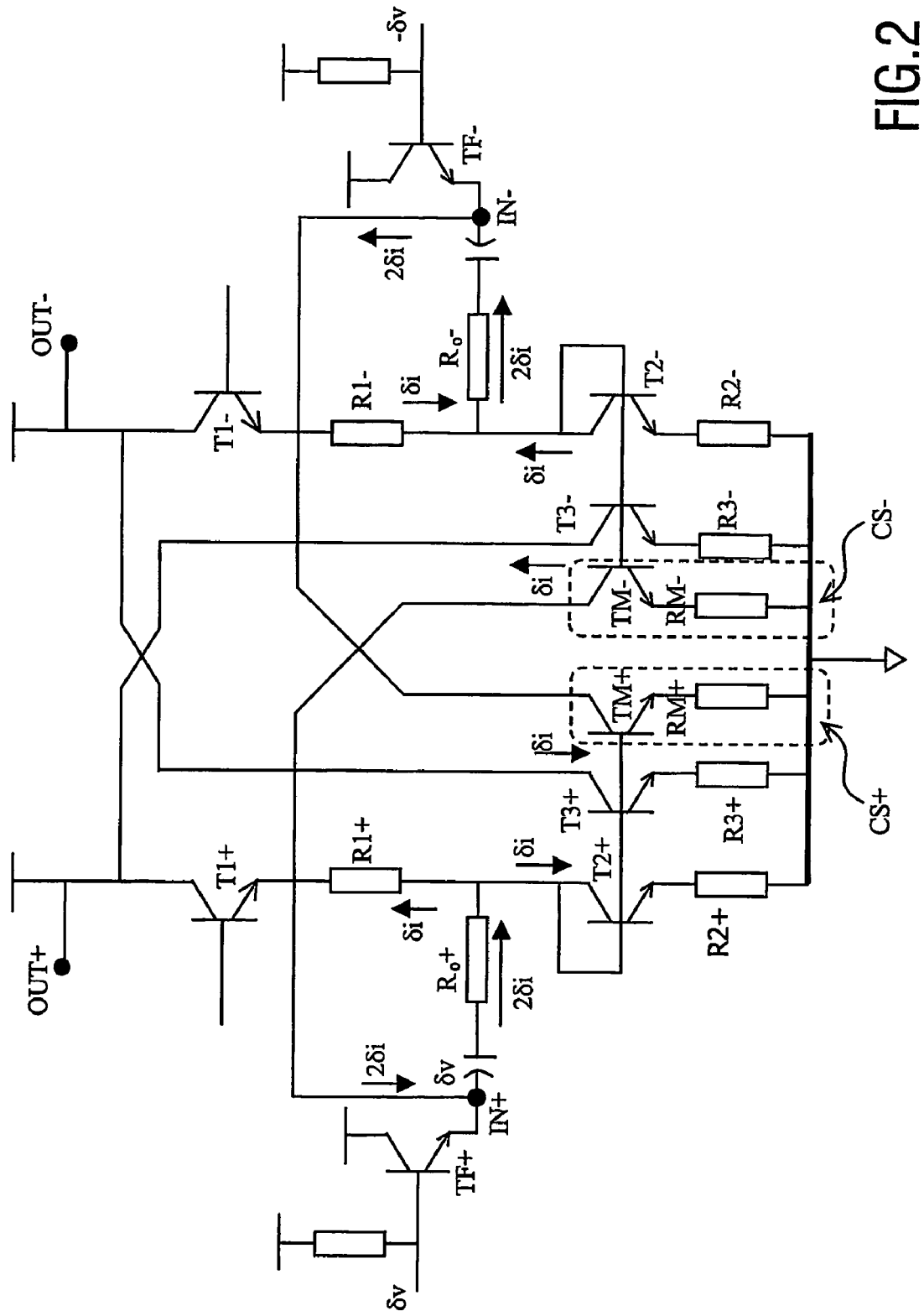
FIG. 2 is a schematic diagram of a use of a transconductance according to the invention.

FIG. 2 represents an exemplary use of a transconductance of the invention that does not suffer from the above-presented drawbacks.

According to the invention, each of the two signals of said differential input voltage are supplied to each input IN+ and IN− respectively, through a follower transistor, TF+ and TF− respectively, connected to said input, IN+ and IN− respectively, by its emitter and receiving said signal on a control electrode. Moreover, each of the two inputs, respectively IN+ and IN−, of the transconductance is connected to a current source CS− and CS+ respectively, that is dynamically controlled by the other input of the transconductance IN− and IN+ respectively. Said current source, CS− and CS+ respectively, is such that the current supplied to each opposite input, IN+ and IN− respectively, by said current source, CS− and CS+ respectively, eliminates current variations 2δi caused by voltage variations +δv and −δv of the input voltage signal.

A positive feedback is thus implemented so as to provide the input with a current equal in magnitude to the one absorbed. The resulting input impedance Zin is then very high. In effect, a signal δv generates a weak current signal δI=2δi−2δi, and the input impedance seen by the follower transistor Zin=δv/δI is very high. The follower transistor TF has no longer current variations to be supplied to the input of the transconductance and does not generate any distortion even at high input voltages.

In the following the functioning of the left side of FIG. 2 will be disclosed. The description of the functioning of the right side is similar. In FIG. 2, the case where resistors R1+, R2+ have identical values and where transistors T1+, T2+ have the same size is illustrated. As seen previously, a voltage variation +δv generates a current that is divided in, two in the branch including T1+ and in the branch including T2+. Consequently, two current variations δi are generated in each branch. The current variation δi generated in T2+ is mirrored by T3+ to output OUT−. The effect of this current variation δi on output OUT− can be added to the effect of the current variation generated in the branch including T1−. The same phenomenon is observed on OUT+ as the current variation δi generated through T2− is mirrored by T3− towards the output OUT+.

FIG. 2 proposes an exemplary implementation of the current source, CS+ and CS− respectively. Said current sources CS+ and CS− each include a current mirror including a mirror transistor, TM+ and TM− respectively, having a control electrode connected to the first and control electrodes of said second transistor, T2+ and T2− respectively, a first electrode connected to the input of the other side, IN− and IN+ respectively and a second electrode connected to said power supply terminal PST.

Figure 3B:
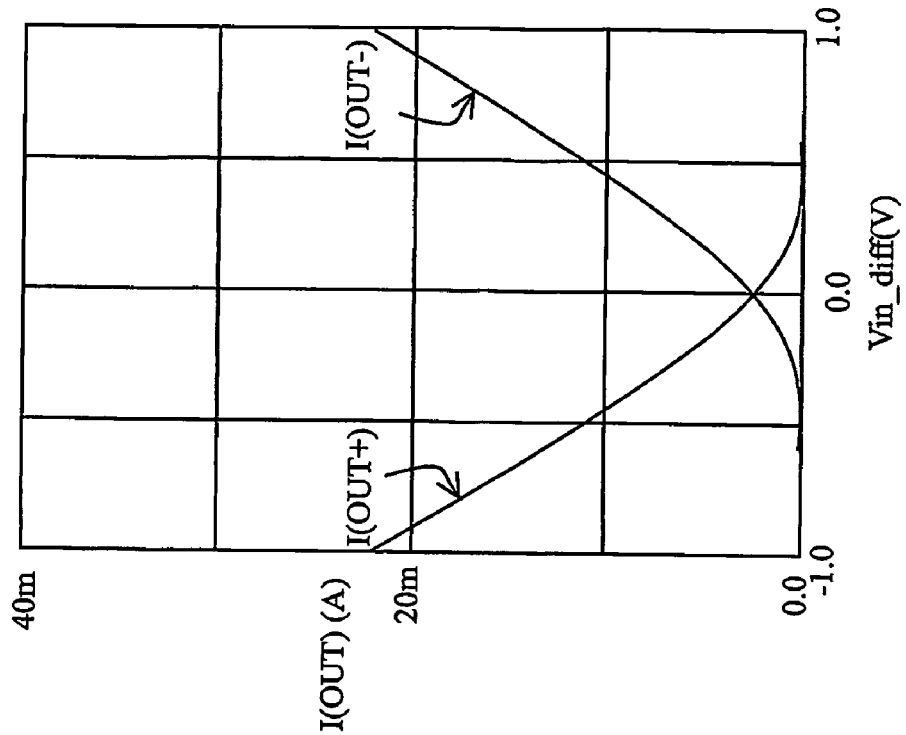
FIG. 3b represents the output currents for a transconductance of the invention.
Figure 3A:
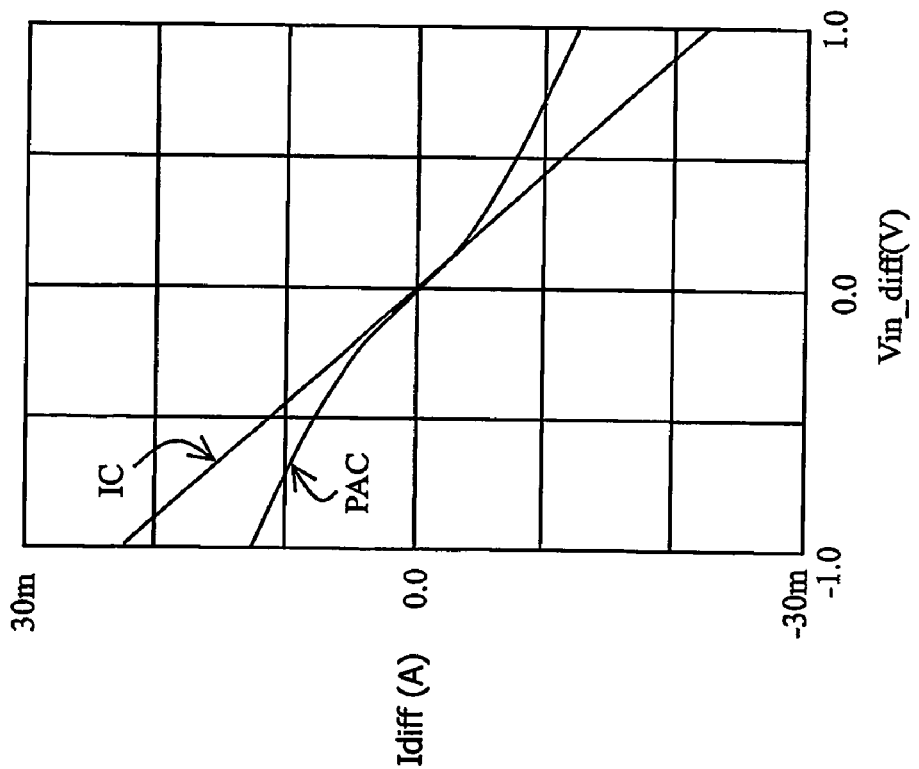
FIG. 3a represents transfer functions of a transconductance according to the prior art and according to the invention.

The current is mirrored with a gain of two in order to cancel the current variations entering at the opposite input. Transistors TM+ and TM− of a size that is double the size of T2 may thus be used. In practice, where transistors do not present an ideal behaviour, the size of said mirror transistor TM is adapted depending on the required range of output current. The connections of said mirror transistor TM+ and TM− to said power supply terminal may be realized through resistors RM+ and RM−. Such resistors are advantageously of the same value as the ones used with said second and third transistors. A transconductance according to such a use presents a high input impedance symmetrical to both positive and negative large voltage swings and a good linearity as illustrated in FIG. 3a for a bias current of 5 mA. The prior art transfer function illustrated by curve PAC is observed to be less linear than the invention transfer function illustrated by curve IC. The transconductance of the invention is shown to be linear even for high output current. FIG. 3b represent the two output currents I(OUT+) et I(OUT−) for the transconductance of the invention. Each output current is not linear, but the differential output current I(OUT+)−I(OUT−)=Idiff is perfectly linear.

Indeed, each input of the transconductance, IN+ and IN− respectively, is directly biased by the feedback realized through the opposite current sources, CS− and CS+ respectively, instead of being biased by a constant current source.

Figure 4:
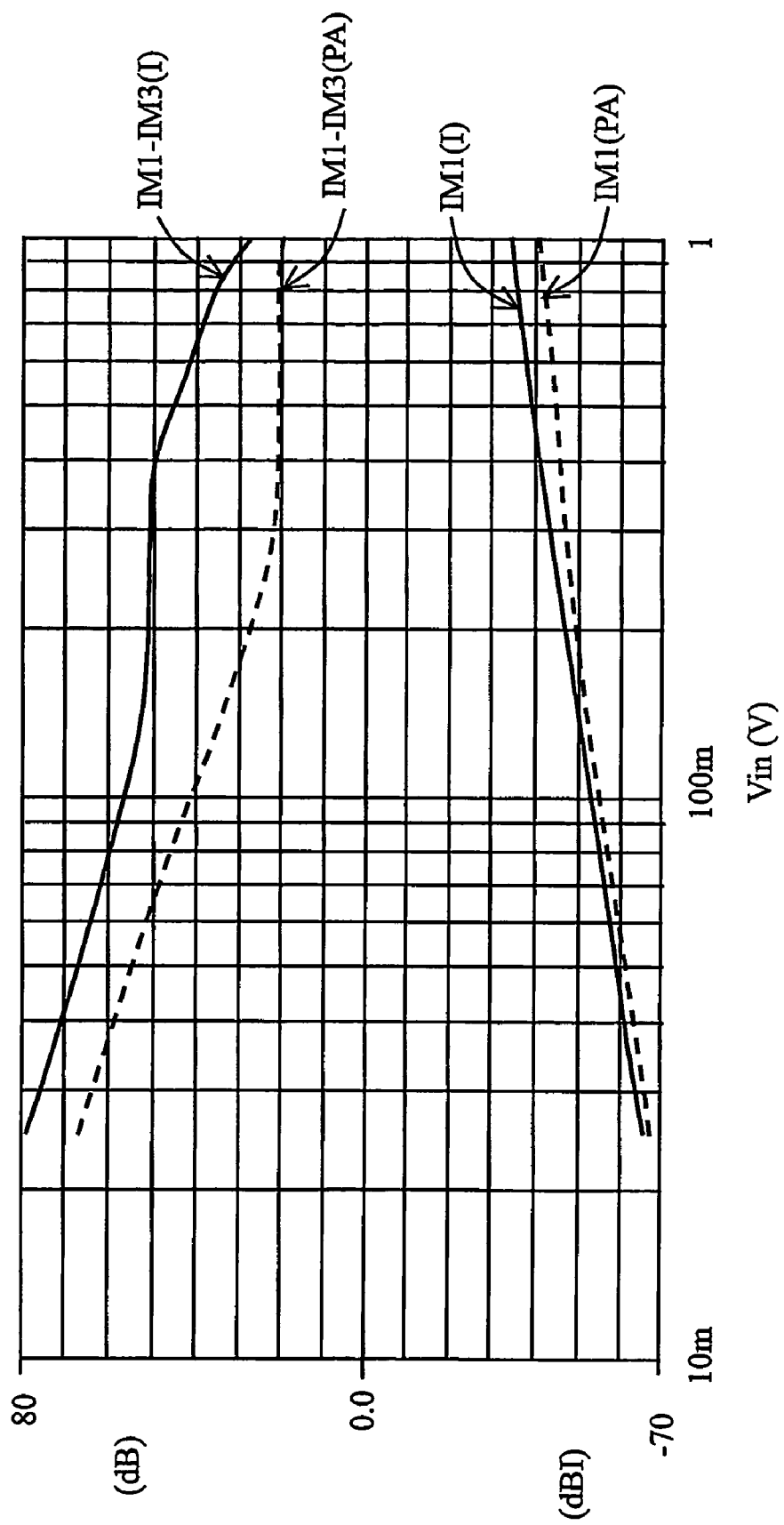
FIG. 4 represents a graph illustrating the performance of a transconductance according to the invention.

The performance of the invention is illustrated in FIG. 4. This figure shows the results of a two-tone analysis performed on the implementation of the prior art, illustrated in FIG. 1 and on the implementation of the invention presented in FIG. 2. The first tone is a differential voltage having an amplitude V and a frequency F1=375 MHz and the second tone is a differential voltage of the same amplitude V and a frequency F2=385 MHz. These two tones are injected at the inputs of the transconductance. At the outputs of the transconductance, two main tones in current, IM1F1 and IM1F2, are obtained at the respective frequencies F1 and F2. Two secondary tones in current, IM3F1 and IM3F2, are also obtained at frequencies F1'=365 MHz and F2'=395 MHz. These secondary tones result from the non linearities of the transconductance. In FIG. 4 are represented the tone IM1F1 for the frequency F1 and the difference between the tones IM1F1 and IM3F1 for frequency F1. The higher this difference is, the more the transconductance linear is. Curves for F2 would be similar. It is thus observed that, at identical bias current, for large input and output signals, the transconductance of the invention is more linear than the one of the prior art. This is illustrated by the fact that the difference IM1F1−IM3F1 is larger and that the slope of IM1F1 representing the gain of the transconductance does not fall for high input voltages. Moreover, the transconductance of the invention is observed to be higher than the one of the prior art. This is illustrated by the gain expressed by the IM1F1 curve. For example, it is observed that a transconductance of the invention can generate two differential tones having an amplitude of 15 mA with a difference IM1F1−IM3F1 of 40 dB and a global bias current of only 10 mA. The two differential tones are obtained with a gain variation below 1 dB. The difference IM1F1−IM3F1 is 12 dB higher than the one obtained with the prior art at low signal levels and is even larger (up to 26 dB) at large input voltage.

Figure 5:
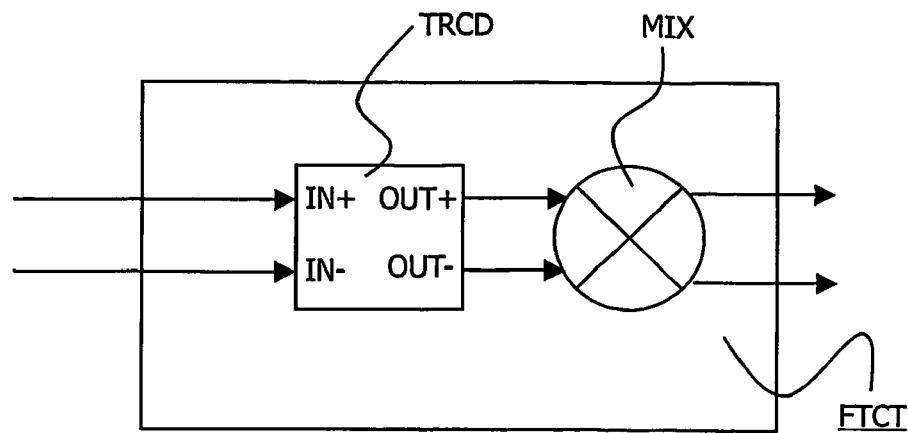
FIG. 5 schematically represents a chip according to the invention.

FIG. 5 illustrates a chip FTCT intended to be implemented in a transceiver according to the invention. Said chip includes at least a transconductance TRCD as previously described and a mixer circuit MIX dedicated to provide a frequency shifted signal from the current output from said transconductance TRCD.

Figure 6:
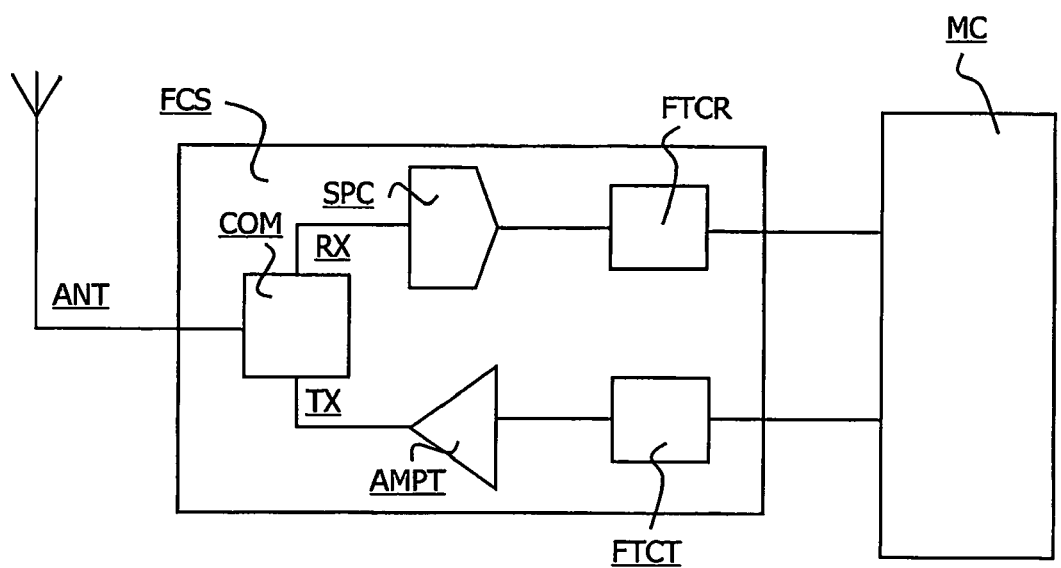
FIG. 6 represents a block diagram of a transceiver of radio frequency signals according to the invention.

FIG. 6 illustrates a block diagram of a transceiver FCS of radio-frequency signals according to the invention. Generally, such a transceiver FCS is intended to receive and transmit signals through an antenna ANT. A commutation device COM controls the access to the antenna ANT. Said commutation device COM is connected at least to a reception chain RX and to a transmission chain TX. Said reception chain RX includes at least a signal processing circuit SPC and a frequency translation unit FTCR, generally constituted by mixer circuits. A processing unit MC follows these circuits. This processing unit MC also processes the signals to be transmitted and is thus connected to a transmission chain TX that includes at least a frequency translation unit FTCT implemented in a chip as previously described in FIG. 5 and an amplification unit AMPT. Such a transceiver is advantageously a telecommunication apparatus: mobile phone . . . . In this exemplary application of the invention, the invention takes place in an upconverter circuit for which the characteristics of the invention are particularly well adapted.

It is to be understood that the present invention is not limited to the aforementioned embodiments and variations and modifications may be made without departing from the spirit and scope of the invention as defined in the appended claims. In this respect, the following closing remarks are made.

It is to be understood that linearity of the transconductance can also be modulated conventionally through the values of the resistors of the transconductance. Notably, modifications of the value of $R_o$ enable such an improvement.

It is to be understood that isolation means can also be added to a circuit of the invention. For example, a transistor can be implemented in cascode with said third transistor, between the collector of said third transistor and the opposite output. This enables to avoid disturbances caused by a charge of said transconductance, for example, a mixer circuit.

It is to be understood that the invention is not limited to the aforementioned telecommunication application. The invention can be used within any application using a reception chain needing a frequency translation before further processing. Radio-frequency application are thus involved in the invention.

It is to be understood that the present invention is not limited to the aforementioned mobile phone application. It can be used within any application using a system where a drift frequency occurs, in automobile application for example.

It is to be understood that the method according to the present invention is not limited to the aforementioned implementation.

Any reference sign in the following claims should not be construed as limiting the claim. It will be obvious that the use of the verb "to comprise" and its conjugations does not exclude the presence of any other steps or elements besides those defined in any claim. The article "a" or "an" preceding an element or step does not exclude the presence of a plurality of such elements or steps.

The invention claimed is:

1. A transconductance circuit to convert a differential input voltage, supplied as two signals on two inputs, into a differential output current, characterized in that, where each of the two signals of said differential input voltage is supplied to each input through a follower transistor connected to said input by its emitter and receives said signal on a control electrode, each of the two inputs of the transconductance circuit is connected to a respective current source that is dynamically controlled by the other input of the transconductance circuit, said current source being such that the current supplied to each input by said current source eliminates current variations caused by voltage variations of the input voltage signal, wherein the transconductance circuit comprises two sides, each side comprising an input, an output, at least a first transistor having a control electrode coupled for receiving a bias voltage, a first electrode connected to said output and a second electrode connected to said input through a resistor, a second transistor having a first electrode and a control electrode in common to said input and a second electrode connected to a power supply terminal, and wherein the first and second transistors of the first side are different from the first and second transistors of the second side.

2. The transconductance circuit of claim 1, wherein said first and second transistors are of the same size.

3. The transconductance circuit of claim 1, wherein each side further includes a third transistor of the same size as said second transistor, said third transistor has a control electrode coupled to said first transistor and control electrodes of said second transistor, a first electrode connected to the output of the other side and a second electrode connected to said power supply terminal.

4. The transconductance circuit of claim 1, wherein said current source includes a current mirror mirroring the current passing through said second transistor with a gain of two.

5. The transconductance circuit of claim 4, wherein said current mirror includes a mirror transistor of twice the size of said second transistor, said mirror transistor having a control electrode connected to the first and control electrodes of said second transistor, a first electrode connected to the input of the other side and a second electrode connected to said power supply terminal.

6. A chip intended to be implemented in a transceiver comprising at least a transconductance as claimed in claim 1.

7. A transceiver of radio-frequency signals comprising at least one chip as claimed in claim 6.

* * * * *